(12) United States Patent
Hong et al.

(10) Patent No.: US 8,460,949 B2
(45) Date of Patent: Jun. 11, 2013

(54) LIGHT EMITTING DEVICE WITH AIR BARS AND METHOD OF MANUFACTURING THE SAME

(76) Inventors: Chang Hee Hong, Seoul (KR); Hyung Gu Kim, Jeollabuk-do (KR)

(*) Notice: Subject to any disclaimer, the term of this patent is extended or adjusted under 35 U.S.C. 154(b) by 746 days.

(21) Appl. No.: 12/648,358

(22) Filed: Dec. 29, 2009

(65) Prior Publication Data

US 2010/0163906 A1 Jul. 1, 2010

Related U.S. Application Data

(63) Continuation-in-part of application No. PCT/KR2009/002913, filed on Jun. 1, 2009.

(30) Foreign Application Priority Data

Dec. 30, 2008 (KR) .................. 10-2008-0137133

(51) Int. Cl.
*H01L 33/00* (2010.01)
(52) U.S. Cl.
USPC .............................. 438/22; 438/29
(58) Field of Classification Search
USPC .................. 438/29, 22; 257/98, E33.068
See application file for complete search history.

(56) References Cited

U.S. PATENT DOCUMENTS

2004/0080938 A1* 4/2004 Holman et al. ............... 362/231

FOREIGN PATENT DOCUMENTS

| JP | 2006-100501 | 4/2006 |
|----|-------------|--------|
| JP | 2007-184619 | 7/2007 |
| KR | 10-2007-0009854 | 7/2007 |
| KR | 10-2007-0081934 | 8/2007 |
| KR | 10-2008-0061695 | 7/2008 |

* cited by examiner

*Primary Examiner* — Calvin Lee
*Assistant Examiner* — Monica D Harrison
(74) *Attorney, Agent, or Firm* — Dilworth & Barrese, LLP.

(57) ABSTRACT

Disclosed are a light emitting device having at least one air bar capable of improving light extracting efficiency and a method of manufacturing the same. With the present invention, there is provided a method of manufacturing a light emitting device including a semiconductor layer(s) having an air-bar layer(s) with a plurality of air bars. The method includes at least one process cycle for forming the semiconductor layer(s). The process cycle includes: forming a patterning thin-film layer on a substrate or a thin-film layer; forming on the patterning thin-film layer an etching guide pattern and an air-bar pattern connected to the etching guide pattern; forming a semiconductor layer(s) on the patterns and exposing the etching guide pattern; wet-etch the exposed etching guide pattern by using a wet-etching solution; and etch the air-bar pattern connected to the etching guide pattern.

21 Claims, 10 Drawing Sheets

Cutting plane line

LIGHT EMITTING DEVICE WITH AIR BARS AND METHOD OF MANUFACTURING THE SAME

RELATED APPLICATIONS

This application claims priority to Korean Patent Application No. 2008-0137133 filed on Dec. 30, 2008 and PCT application No. PCT/KR2009/002913 filed on Jun. 1, 2009, the entire contents of which are incorporated herein by reference.

FIELD OF THE INVENTION

The present invention relates to a light emitting device and a method of manufacturing the same, more specifically, to a light emitting device having at least one air bar capable of improving light extracting efficiency and a method of manufacturing the same.

DESCRIPTION OF THE RELATED ART

When a semiconductor light emitting device is typically manufactured by using a metal organic chemical vapor deposition (MOCVD) method, a buffer layer, an n-type layer, an active layer, and a p-type layer are grown on a substrate in that order, and then a dry etching is carried out to shape a mesa form. Then, a current diffusion layer is formed on the p-type layer by performing a metal deposition and a patterning process, and then an n-type and a p-type electrode are formed by performing a metal deposition, a patterning, and an annealing process. Here, the n-type electrode is formed at a part of the n-type layer, and the p-type electrode is formed at a region on the current diffusion layer.

In the light emitting device, the same structure as a light waveguide is formed between the substrate and a surface of the device. Accordingly, since large amount of beams of light generated in the active layer are internally totally reflected on the surface of the device, a substrate interface, or a substrate back interface, most of the beams of light are unable to be discharged to outside and eventually internally disappear, causing a light extracting efficiency to be lowered. To solve such a problem, methods have conventionally been suggested, wherein surface roughness is applied to a surface of the p-type or the n-type layer, or reflecting or scattering center is formed on the substrate itself to change a path of the totally reflected light. However, even if the conventional method causes a satisfactory result when the light is vertically extracted by the reflecting or scattering center, it causes difficulty when the light is laterally extracted. Further, it takes a longer process time to apply the roughness to the substrate itself, lowering process efficiency.

SUMMARY OF THE INVENTION

The present invention, which is contrived to solve the aforementioned problem, provides a light emitting device in which at least one air bar layer capable of improving light extracting efficiency is formed at a region where a semiconductor layer is formed and a method of manufacturing the same.

In accordance with an aspect of the present invention, there is provided a light emitting device including at least one semiconductor layer; and at least one air-bar layer including a plurality of air bars formed in the semiconductor layer(s).

Some of the semiconductor layers of the device may include at least one air-bar layer formed with a plurality of air bars in the inside.

The air-bar layer(s) may include a plurality of air bars formed in the semiconductor layer(s) is provided in a plural number.

The air bars formed in the semiconductor layer(s) may further include air gaps formed by being connected along the air bars.

The air bars may have a three-dimensional shape, and the air bars having the three-dimensional shape are periodically or randomly arranged.

The air bars may have different three-dimensional shapes, and the air bars having the different three-dimensional shapes are periodically or randomly arranged.

The air-bar layers may be arranged crossing each other.

The air-bar layers may be arranged crossing each other on a vertical planar surface.

Each of the air-bar layers may be arranged side by side on a horizontal planar surface.

The air-bar may be filled with a filing material.

The filling material may include a metal.

The filing materials may include a fluorescent material.

The filing materials may include a fluorescent material, and sectional areas of the air bars are larger than a particle size of the fluorescent material.

The air bars may be periodically arranged.

The air bars may be brought into contact with a substrate or a thin-film layer, and an inner inclined angle between the air bars and the substrate or the thin-film layer may be in a range of 20° to 70°.

An uneven scattering surface may be formed on an external surface of an uppermost layer of the semiconductor layer(s).

The device may further include a transmissive conductive film formed on an external surface of an uppermost layer of the semiconductor layer(s); and an uneven scattering surface formed on the transmissive conductive film.

The semiconductor layers may include an n-type layer, an active layer, and a p-type layer.

In accordance with another aspect of the present invention, there is provided a method of manufacturing a light emitting device including a semiconductor layer(s) having an air-bar layer(s) with a plurality of air bars. The method includes at least one process cycle, for forming the semiconductor layer(s). The process cycle may include: forming a patterning thin-film layer on a substrate or a thin-film layer; forming on the patterning thin-film layer an etching guide pattern and an air-bar pattern connected to the etching guide pattern; forming a semiconductor layer(s) on the patterns and exposing the etching guide pattern; wet-etching the exposed etching guide pattern by using a wet-etching solution; and etching the air-bar pattern connected to the etching guide pattern.

The process cycle may further include at least one process cycle resulting at least two semiconductor layers. The process may include: forming a patterning thin-film layer on the semiconductor layer(s) on which the air bars are formed; forming on the patterning thin-film layer an etching guide pattern and an air-bar pattern connected to the etching guide pattern; forming an additional semiconductor layer(s) on the patterns and exposing the etching guide pattern; wet-etching the exposed etching guide pattern by using a wet-etching solution; and etching the air-bar pattern connected to the etching guide pattern.

The method may further include forming at least one additional semiconductor layer on the semiconductor layer(s), with the air bars, made by repeating the process cycle, the process cycle further comprising: forming a patterning thin-film layer on the semiconductor layer(s) for the air bars; forming on the patterning thin-film layer an etching guide pattern and an air-bar pattern connected to the etching guide pattern; forming an additional semiconductor layer(s) on the patterns and exposing the etching guide pattern; wet-etching the exposed etching guide pattern by using a wet-etching solution; and etching the air-bar pattern connected to the etching guide pattern.

In the forming of the etching guide layer and the air-bar pattern connected thereto, an air-gap pattern may be further formed.

The air-bar layers may be arranged crossing each other.

The air-bar layers may be arranged crossing each other at a crossing angle(s).

The patterning thin-film layer may be made of one of oxide, nitride, tungsten, and platinum.

The wet-etching solution may include at least one of sodium hydroxide, potassium hydroxide, sulfuric acid, phosphoric acid, aluetch, and hydrofluoric acid.

A wet-etching may be induced by forming an electrode on a surface of the semiconductor layer(s) and supplying a current or a beam of light thereto.

The semiconductor layers may include an n-type layer, an active layer, and a p-type layer, and the semiconductor layers are formed by using a selective MOCVD method.

The method may further include forming an uneven scattering surface on an external surface of an uppermost layer of the semiconductor layer(s).

The method may further include forming a transmissive conductive film on an external surface of an uppermost layer of the semiconductor layer(s); and forming an uneven scattering surface on the transmissive conductive film.

The method may further include separating the semiconductor layer(s) from the substrate.

In the separating of the semiconductor layer(s) from the substrate, an LLO method may be used.

In the separating of the semiconductor layer(s) from the substrate, a CLO method may be used.

The etching guide pattern and the air-bar pattern, respectively or together, may be periodically arranged.

The method may further include filling a fluorescent material in the air bars by using a spin coater.

The method may further include filling a fluorescent material in the air bars by using an ultrasonic wave.

The method may further include filling a metal in the air bars by using an electroplating method.

In accordance with another aspect of the present invention, there is provided a method of manufacturing a light emitting device including a plurality of semiconductor layers having an air-bar layer(s) with a plurality of air bars. The method may include processes of: forming a patterning thin-film layer on a substrate or a thin-film layer; forming on the patterning thin-film layer an etching guide pattern and an air-bar pattern connected to the etching guide pattern; forming a semiconductor layer(s) on the patterns and exposing the etching guide pattern; (A) forming a patterning thin-film layer on the semiconductor layer(s); (B) forming on the patterning thin-film layer an etching guide pattern and an air bar pattern connected to the etching guide pattern; (C) forming an additional semiconductor layer(s) on the patterns and exposing the etching guide pattern; continuously repeating the processes (A) to (C) while aligning positions of the exposed etching guide patterns; continuously performing etching along the etching guide patterns (the positions of the etching guide patterns being aligned to connect top to bottom) exposed on each uppermost layer of the semiconductor layers by using a wet-etching solution; and etching the air-bar patterns connected to the etching guide patterns on the layers.

After the process of continuously repeating the processes (A) to (C) while aligning positions of the exposed etching patterns, a metal thin film(s) and another semiconductor layer(s) where no air-bar pattern may be formed are stacked together or individually and a mask layer may be provided to perform a photolithography, and then, when an upper layer of the semiconductor layer(s) where the air-bar pattern is formed is etched, a wet etching may be carried out by using the wet-etching solution.

DESCRIPTION OF THE EMBODIMENTS

An embodiment of the present invention will now be described with reference to the accompanying drawings which form a part hereof. The embodiment is only examples of the present invention, serving only for explaining the scope of the present invention to any person of ordinary skill in the art. Accordingly, the present invention is not limited to the following embodiment. Moreover, various modifications, permutations and additions are possible within the principles and spirit of the invention, the scope of which shall be defined by the appended claims and their equivalents.

Figure 1:
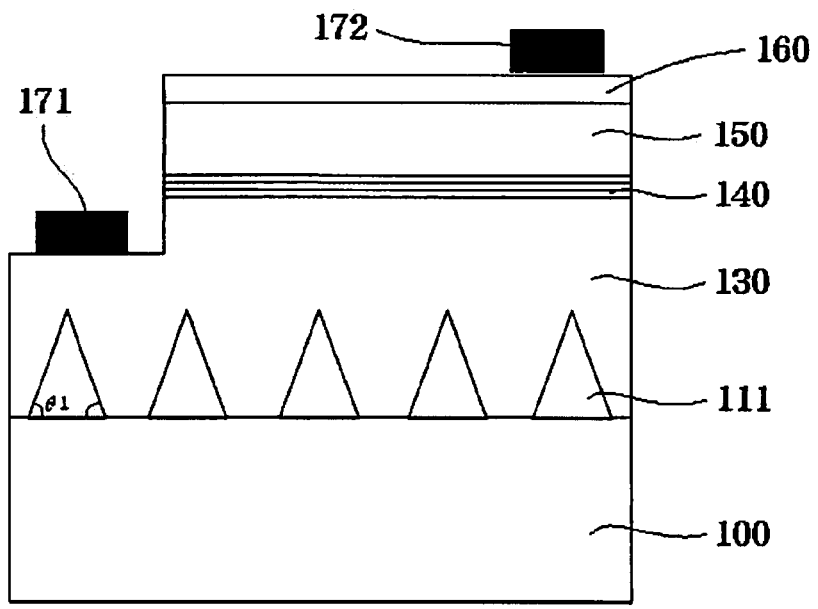
FIG. 1 is a sectional view showing a light emitting device in accordance with an embodiment of the present invention.

FIG. 1 is a sectional view showing a light emitting device having an air bar 111 in accordance with an embodiment of the present invention. The air bars 111 indicate hollow portions inside semiconductor layers 130, 140, and 150. At this time, filling materials may be filled in the hollow portions. The air bar having a prism or pyramid shaped section is also referred to as air prism 114 or air gap 115 (see FIGS. 20 and 21). Air bars may have a form in which air gaps are intermittently formed along air prisms.

As shown in FIG. 1, the light emitting device in accordance with the present embodiment can include a substrate 100, the semiconductor layers 130, 140, and 150 formed on the substrate 100, and the air bars formed on the semiconductor layers 130, 140, and 150.

Provided at a top portion of the semiconductor layers 130, 140, and 150 are electrode pads 171 and 172 through which a current is supplied.

In the light emitting device, if an external current is supplied through the electrode pads 171 and 172, an active layer 140 of the semiconductor layers 130, 140, and 150 functions as a light-emitting area or a light-emitting region.

Here, one of a sapphire substrate, a silicon carbide (SiC) substrate, a silicon (Si) substrate, a zinc oxide (ZnO) substrate, a gallium arsenide (GaAs) substrate, and a gallium phosphide (GaP) may be employed as the substrate 100. In the present embodiment, the sapphire substrate is used.

The air bars 111 scatters beams of light traveling to the sapphire substrate 100 among the beam of light generated from the semiconductor layers 130, 140, and 150 to improve the light extracting efficiency.

Figure 2:
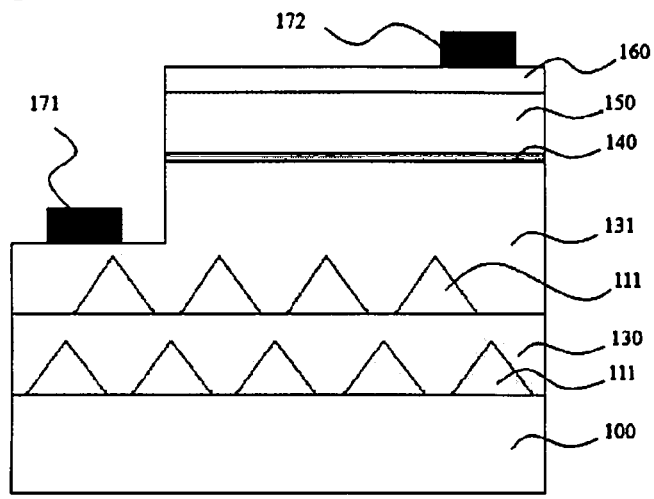
FIG. 2 is a sectional view showing a light emitting device having multiple air bars.
Figure 8:
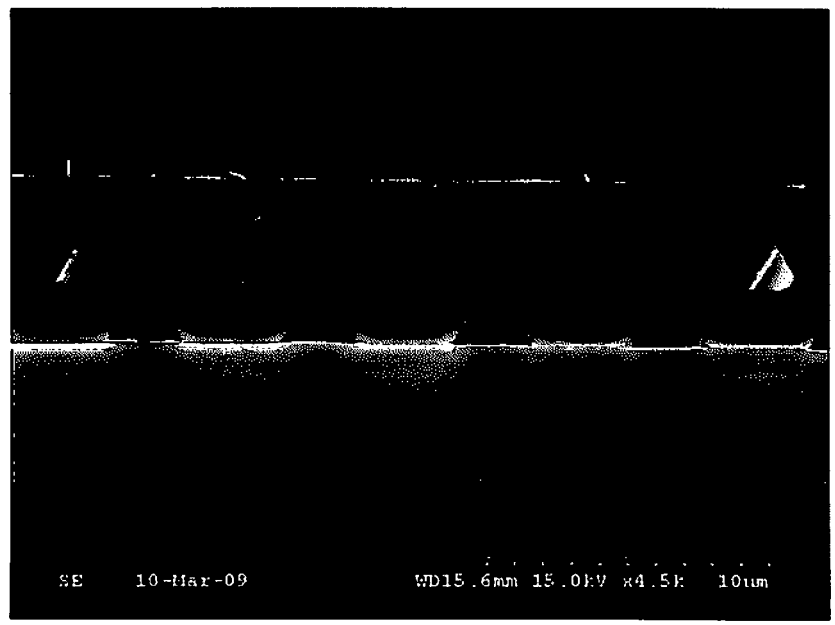
FIG. 8 is a SEM photograph showing a gallium nitride layer on which the multiple air bars are formed.

FIG. 2 is a sectional view showing a light emitting device in which the air bars are formed in a two-layer structure, and FIG. 8 is a SEM photograph showing the air bars formed in the two-layer structure.

As shown in FIGS. 1 to 8, in the present embodiment, the air prisms 114, i.e. the air bars 111 having the prism-shaped section, are used. However, the present invention is not limited thereto, and the air bars may be of various shapes such as a trigonal pyramid, a hexagonal pyramid and the like.

Figure 3:
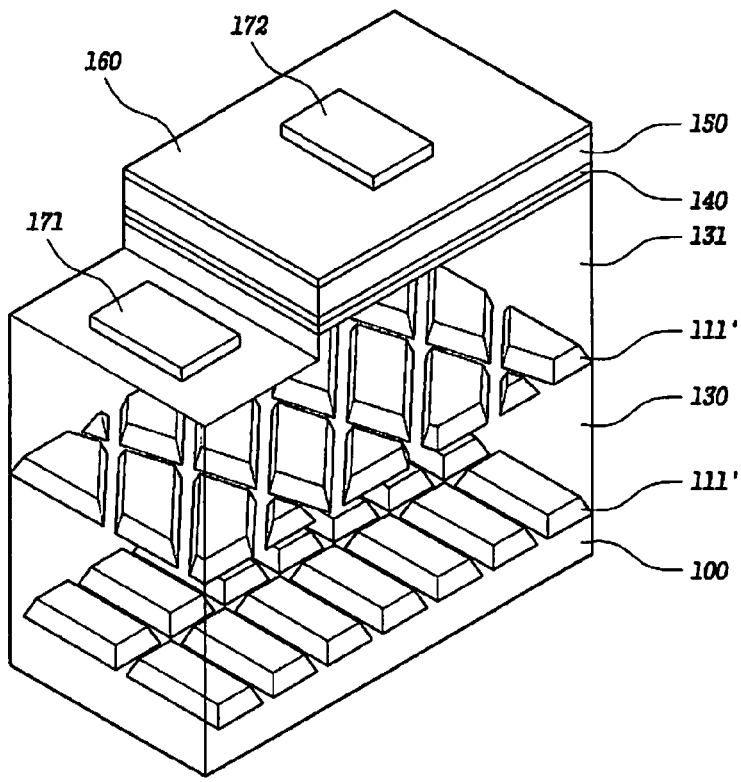
FIG. 3 three-dimensionally shows how air bars are formed in a two-layer structure.
Figure 4:
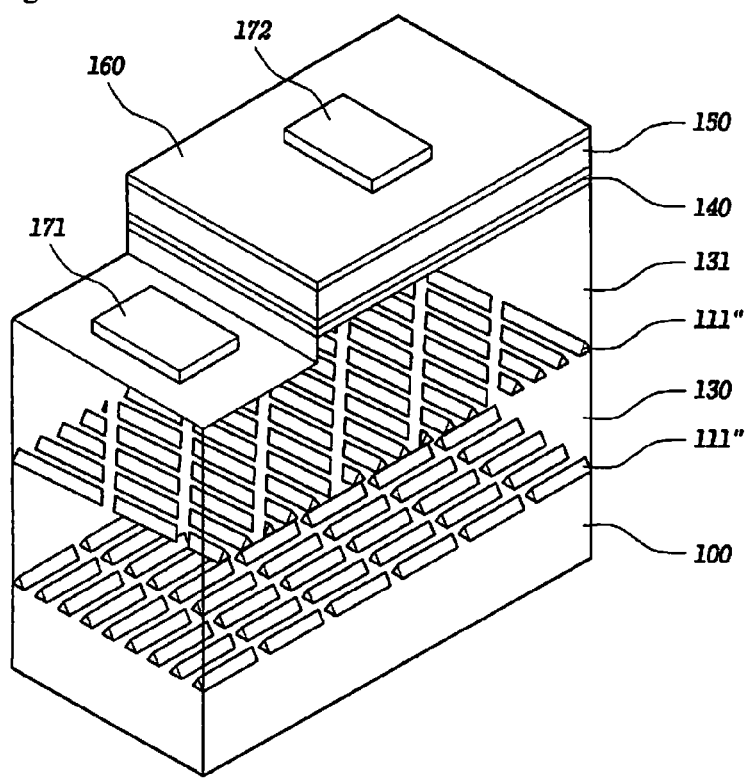
FIG. 4 three-dimensionally shows how air prisms are formed in a two-layer structure.
Figure 5:
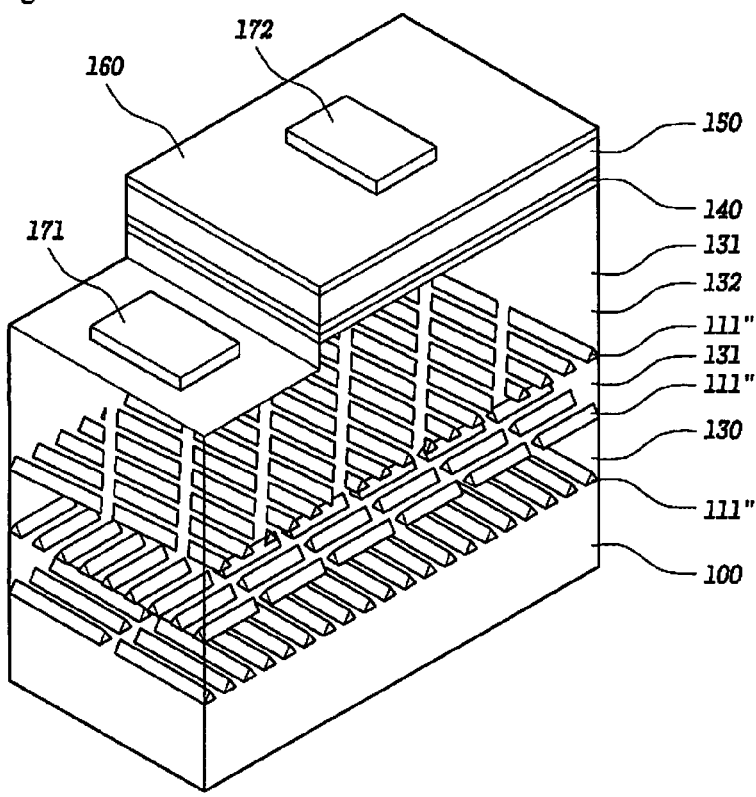
FIG. 5 three-dimensionally shows how air prisms are formed in a three-layer structure.

As shown in FIG. 3, the air bars 111 can be transformed into trapezoid air bars 111'. When the air bars 111' are stacked in a multi-layer structure, a same pattern may be repeated or different patterns may be applied to each layer to reduce a space between the air bars formed in the same semiconductor layer, thereby improving the light extracting efficiency. Alternatively, one pattern and another pattern may cross each other. Moreover, as shown in FIG. 4, air bars 111" may be formed in various sizes, and the air bars 111" may be arranged in various forms.

Figure 6:
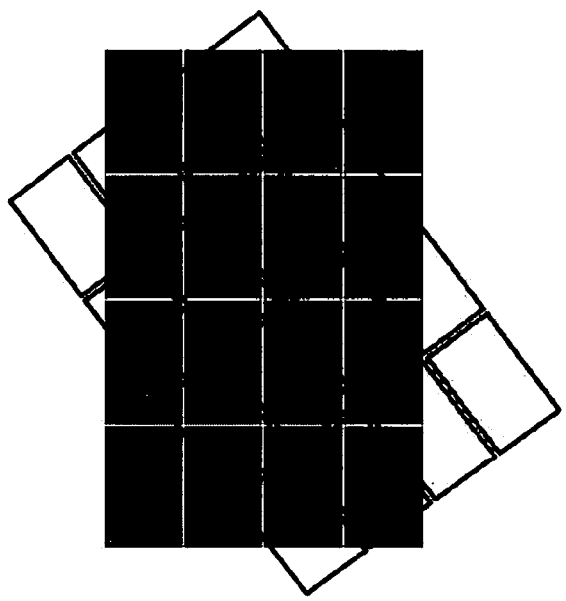
FIG. 6 is a top plan view showing how air bars are formed in a two-layer structure.
Figure 7:
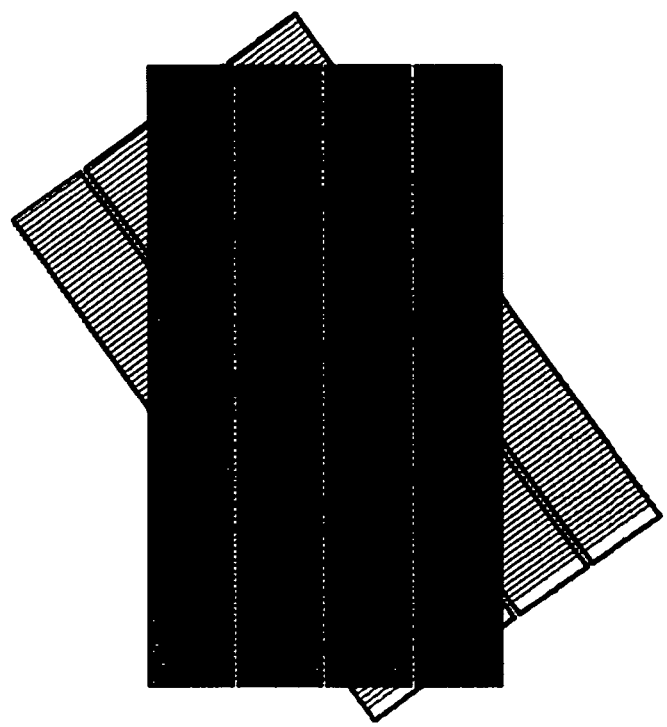
FIG. 7 is a top plan view showing how air prisms are formed in a three-layer structure.

As shown in FIGS. 6 and 7, one layer and another layer with the air bars are formed may also cross each other.

Here, patterns 212, 223, and 213 used for forming the air bars 111, 114, and 115 may be made of one of oxide, nitride, tungsten (W), and platinum (Pt). In the case of etching guide pattern 212, it may be required that the semiconductor layers are not sealed on the pattern region. In contrast, in the case of air bar and air gap pattern, it may be required that the semiconductor layers are sealed on the pattern region.

The semiconductor layers can include an n-type layer 130, the active layer 140, and a p-type layer 150, which may be preferably made of at least one of a silicon (Si) film, a gallium nitride (GaN) film, an aluminum nitride (AlN) film, an indium gallium nitride (InGaN) film, an aluminum gallium nitride (AlGaN) film, an aluminum indium gallium nitride (AlInGaN) film, and a semiconductor layer having the same. Here, the n-type layer 130 having electrons as carriers may include an n-type semiconductor layer and an n-type clad layer. The n-type semiconductor layer and the n-type clad layer may be formed by adding to a semiconductor thin film n-type impurities such as, e.g., Si, Ge, Se, Te, C and/or the like.

The p-type layer 150 having holes as carrier may include a p-type semiconductor layer and a p-type clad layer. The p-type semiconductor layer and the p-type clad layer may be formed by adding to a semiconductor thin film n-type impurities such as, e.g., Mg, Zn, Be, Ca, Sr, Ba, and/or the like.

In addition, in the active layer 140, beams of light having specific wavelengths are generated by re-bonding electrons supplied from the n-type layer 130 and holes supplied from the p-type layer 150. The active layer 140 may be formed by using a multilayered semiconductor thin film having a single or a multiple quantum well where well layers and barrier layers are alternately stacked. At this time, the wavelength of the generated beam of light may be varied depending on a semiconductor material constituting the active layer 140. It is preferable to select a semiconductor material adequate for a desired wavelength.

In the meantime, since no semiconductor layer is grown on an etching guide pattern made of one of oxide, nitride, tungsten (W), and platinum (Pt), the pattern is exposed toward the top surface of the semiconductor layers 130, 140 and 150 with the growing of the semiconductor layers 130, 140 and 150, thereby forming an opening. By using a wet-etching solution soaked through the opening, the etching guide pattern is removed on the sapphire substrate. If the pattern is removed, an N surface of a nitride semiconductor along the pattern 223 is exposed in a space where the pattern 223 is located. Accordingly, the N surface can be wet-etched to form the air prisms 114 as the prism type air bars 111. Here, the opening for etching, provided on the top surface of the semiconductor layers 130, 140 and 150 may be formed in a circular or polygonal shape depending on the shape of the etching guide pattern.

At this time, a lower portion of the air bars 111 may be in contact with the substrate 100. An inner inclined angle θ1 between the air bars 111 and the substrate 100 is preferably in the range of 20° to 70° based on the substrate 100. Accordingly, through an inner inclined surface of the air bars 111, it is possible to deflectively control the beams of light traveling to the sapphire substrate 100 by internally total reflection.

At least one semiconductor layer including such air bars can be overlappingly formed. Specifically, a silicon oxide dot pattern as the etching guide pattern 212 and a stripe pattern as the air-bar pattern extending through the silicon oxide dot pattern are formed. Then, a gallium nitride layer is grown and, again, a silicon oxide dot pattern and a stripe pattern extending through the silicon oxide dot pattern are formed. Then, a gallium nitride layer is grown again. Thereafter, if a wet-etching solution is inserted through the patterned opening where no gallium nitride is grown on the silicon dot and flows along the stripe pattern to perform the etching in the stripe pattern, a space through the wet-etching solution can be soaked is formed to form such air bars.

The reference numeral 111 denotes vertical sections of the air bars having prism shapes. If the etching is performed along the air-bar pattern 223, the air prisms 114 can be formed. The air gaps 115 having hexagonal-pyramid shapes can be formed on the air-gap pattern 213. The air prisms 114 are air bars having prism shapes. Other shaped air bars and the air prisms 114 can be used together.

The electrode pads can include an n-type electrode pad 171 made in contact with the n-type layer 130 and a p-type electrode pad 172 made in contact with the p-type layer 150. Here, each of the n-type and the p-type electrode pad 171 and 172 may preferably formed by using a single or multi-layered film made of at least one of Pb, Sn, Au, Ge, Cu, Bi, Cd, Zn, Ag, Ni, Ti, and a compound having the same. Further, the p-type electrode pad 172 of the electrode pads 171 and 172 may be formed on the current diffusion layer 160 that has been formed on the p-type layer 150.

A process of manufacturing the light emitting device in accordance with the embodiment of the present invention will be described hereinafter.

Figure 9:
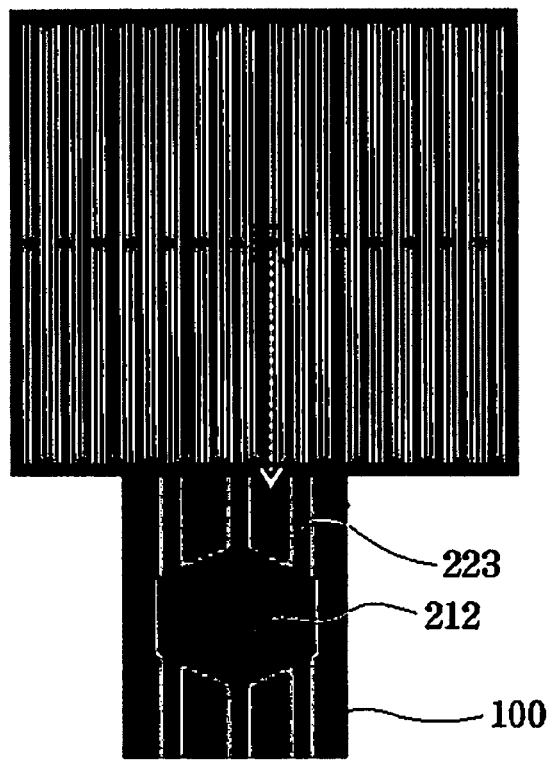
FIG. 9 is a plan view showing how a pattern functioning as a mask is formed in accordance with the embodiment of the present invention.
Figure 10:
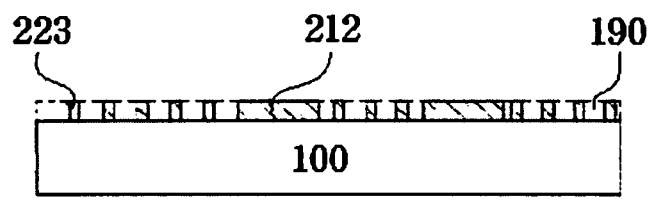
FIG. 10 is a sectional view showing how a pattern functioning as a mask is formed in accordance with the embodiment of the present invention.
Figure 11:
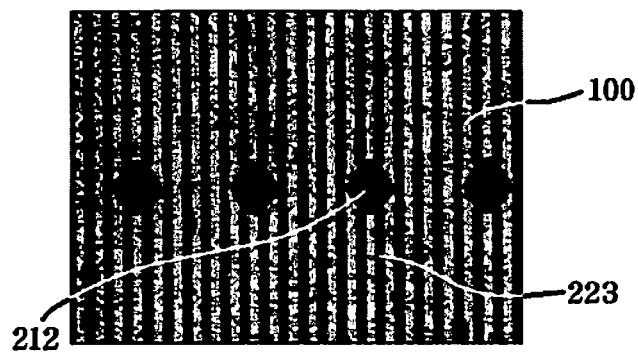
FIG. 11 is an optical photograph showing a surface of the light emitting device where air bars have been formed.
Figure 12:
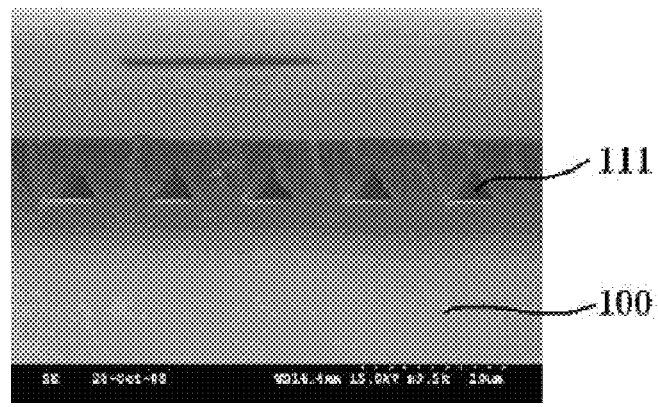
FIGS. 12 and 13 are SEM photographs showing a side surface of the light emitting device where air bars have been formed.
Figure 13:
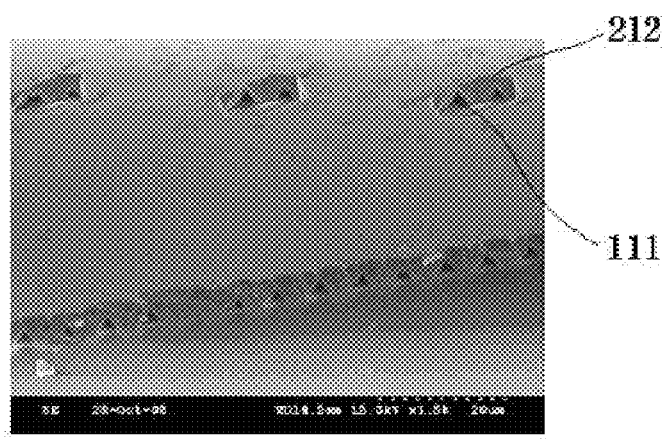

FIG. 9 is a plan view showing how a pattern functioning as a mask is formed in accordance with the embodiment of the present invention, and FIG. 10 is a sectional view showing how a pattern functioning as a mask is formed in accordance with the embodiment of the present invention. FIG. 11 is an optical photograph showing a surface of the light emitting device where air bars have been formed, and FIGS. 12 and 13 are SEM photographs showing a side surface of the light emitting device where air bars have been formed.

A method of manufacturing the light emitting device in accordance with the embodiment of the present invention will be described with reference to FIGS. 11 to 13.

As shown in FIGS. 9 and 10, the substrate 100 is provided, and a patterning thin film 190 having a predetermined thickness is formed on the substrate 100. At this time, other thin films may exist on the substrate 100.

Here, the patterning thin film layer 190 may preferably be heat-resistant against about 600° C. The patterning thin film 190 can be formed by depositing at least one of an oxide based material (e.g., $XO_y$ or $X_2O_y$, X is one of Ba, Be, Ce, Cr, Er, Ga, In, Mg, Ni, Si, Sc, Ta, Ti, Zn, and Zr, and $0<y\leqq9$), a nitride based material (e.g., SiNx), tungsten (W), and platinum (Pt) by use of a plasma chemical vapor deposition (CVD), an E-beam, or a sputtering method. At this time, the patterning thin film 190 may be preferably formed to have a thickness of about 300 nm or less. Successively, the air-bar pattern (stripe pattern) is formed on the patterning thin film 190, and the etching guide pattern is formed such that openings to be exposed on the semiconductor layers are spaced from each other (see FIG. 4). Alternatively, instead of the patterning process, the pattern may be formed by performing a lift-off process.

Here, the etching guide pattern 212 and the air-bar pattern 223 may have different sizes. Further, the etching guide pattern 212 and the air-bar pattern 223 may be periodically arranged.

At this time, the etching guide pattern 212 and the air-bar pattern 223 may be formed while being connected to each other.

Figure 18:
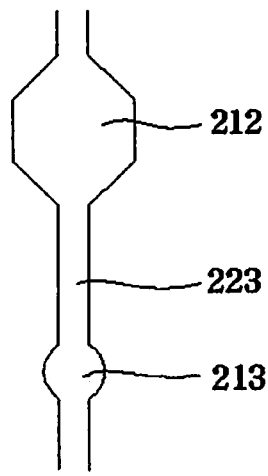

As shown in FIG. 18, in the etching guide pattern 212, the opening having a hexagonal shape may be formed on the semiconductor layer. Alternatively, instead of the hexagonal shape, the etching guide pattern 212 may have an opening horizontal section of various shapes such as a triangle, a polygon and the like. Moreover, the air-bar pattern 223 may be preferably connected to the etching guide pattern 212 in a linear connection form. The air gap pattern 213 may be formed along the air-bar pattern 223. The air-gap pattern 213 may be periodically or aperiodically formed, and the prism shaped air bars, i.e., the air prisms 114, may be formed by using only the air-bar pattern 223 without formation of the air-gap pattern 213.

As shown in FIG. 2, the semiconductor layers 130, 140, and 150 may be formed on the etching guide pattern 212 and the air-bar pattern 223. At this time, by repeating the above processes, the air bars 111 or the air prisms 114 and an n-type layer (gallium nitride) 131 can be formed (see FIGS. 2 and 3). If the processes are repeated many times, it is possible to obtain a multiple air-bar layer.

Here, the semiconductor layers 130, 131, 140, and 150 may include the n-type layers 130 and/or 131, the active layer 140, and the p-type layers 150 and formed by a selective metal organic chemical vapor deposition (MOCVD) method.

Specifically, in order to form the semiconductor layers, the n-type layer 130 may be formed on the substrate 100 where the patterns 212 and 223 are formed; and, again, the n-type layer 131, the active layer 140, and the p-type layer 150 may be stacked in that order on the substrate 100 where the patterns 212 and 223 are formed. In the present embodiment, the n-type layers 130 and 131 are formed by adding the aforementioned n-type impurities to the nitride thin film. Further, a multiple quantum well having an $In_{1-x}Ga_{1-y}Al_{1-z}N/In_{1-x}Ga_{1-y}Al_{1-z}N$ may be formed by alternately depositing well layers and barrier layers, and the active layer 140 may be formed by adjusting x, y, and z ($0\leqq x, y, z \leqq 1$). While, a nitride thin film may be deposited on the active layer 140 again, the p-type layer 150 may be formed by adding the aforementioned p-type impurities.

Here, the semiconductor layers may be preferably subjected to a lateral epitaxial overgrowth (LEO) and a selective EPI growing (SEG) by using a metal organic chemical vapor deposition (MOCVD) method.

If the LEO is performed, a lateral growth is predominant on the pattern where the air bars are to be formed, thereby sealing a top portion of the pattern. The thin film crystalline growth is made to fully cover the air-bar pattern 223 by successive EPI growth on the top portion of the pattern where the air bars are to be formed.

Successively, after the p-type layer 150 is finally stacked in a successive order, the relatively wide etching guide pattern 212 where no growth is made may be exposed on the upper surface of the semiconductor layers 130, 131, 140, and 150.

Accordingly, the etching guide pattern 212 may be exposed through an opening when viewed from an upper side of the semiconductor layers 130, 131, 140, and 150, and the air-bar pattern 223 may grow in a planar surface by being covered by the semiconductor layer. The shape of the air-bar pattern 223 is not limited to the present embodiment. If a condition is satisfied, capable of allowing semiconductor to horizontally grow to be formed into a plane on an upper surface of the air-bar pattern 223 being connected to the etching guide pattern 212, the air-bar pattern 223 can grow in various forms.

Then, the etching guide pattern 212 exposed for forming the air bars may be wet-etched by using a wet-etching solution. Here, the wet-etching solution may include at least one of sodium hydroxide (NaOH), potassium hydroxide (KOH), sulfuric acid ($H_2SO_4$), phosphoric acid ($H_3PO_4$), Aluetch ($4H_3PO_4+4CH_3COOH+HNO_3+H_2O$), and hydrofluoric acid (HF).

Therefore, the exposed etching guide pattern 212 may be removed through the aforementioned wet-etching.

Alternatively, the exposed etching guide pattern 212 may be removed by forming an electrode on a surface to use an electrochemical method or by using a photo-enhanced chemical (PEC) method. Such methods are applicable to the etching of air-bar pattern, air-gap pattern, and semiconductor layer for forming air bars.

Successively, the air-bar pattern 223 connected to the etching guide pattern 212 may be etched. A wet-etching solution may be supplied through the etching guide pattern 212. By using the wet-etching solution, the wet-etching may be carried out along the air-bar pattern 223.

Here, the etching of the etching guide pattern 212 and the air-bar pattern 223 and the etching of the semiconductor layer may be carried out together by using the same wet-etching solution or successively by using different kinds of wet-etching solutions.

For example, the air-bar pattern 223 connected to the etching guide pattern 212 may be etched by using the wet-etching solution that is used for etching the etching guide pattern 212 formed on the substrate 100.

A nitride plane (000-1) as a lower surface of the semiconductor layer may be exposed above a space where the air-bar pattern 223 has been removed. Here, when the wet-etching is carried out, the upper surface of the semiconductor layers may be hardly etched.

In other words, in the semiconductor layers 130, 131, 140, and 150, the etching selectivity of a gallium plane (0001) may be different from that of the nitride plane (000-1). Accordingly, the nitride plane (000-1) of the semiconductor layers 130, 131, 140, and 150 may be relatively more quickly etched, to thereby form the prism type air bars 111, i.e., the air prisms 114.

Here, the air bars 111 shown in vertical sections, i.e., the air prisms 114, may three-dimensionally formed. Specifically, the air prisms having same three-dimensional shape or different three-dimensional shapes may be formed in a plural number. Further, the air bars may be formed in various shapes such as prim (114), hexagonal pyramid (115), and trigonal pyramid by changing the shape of the patterns 223 and 213 on a position where air bars are to be formed.

Then, as shown in FIG. 1, a current diffusion layer 160 may be formed on the semiconductor layers and, then, a patterning process may be performed to partially remove the current diffusion layer 160. At this time, the current diffusion layer 160 may be preferably formed of a transmissive conductive film such as indium tin oxide (ITO), indium zinc oxide (IZO) or the like. In the patterning process, some regions of the n-type layer 130 and the active layer 140 may be mesa-etched to expose a region of the n-type layer 130 where an n-type electrode is to be formed.

As shown in FIG. 1, a metal deposition, a patterning, and an annealing process may be carried out on the exposed part of the n-type region and a part of the current diffusion layer 160 to form an n-type electrode (or electrode pad) 171 and a p-type electrode (or electrode pad) 172.

An electrochemical etching may be also carried out by supplying a current or a beam of light through the electrodes 171 and 172 formed on the surfaces of the semiconductor layers 130, 140, and 150.

Further, in the method of manufacturing the light emitting device in accordance with the embodiment of the present invention, the stacked semiconductor layers 130, 131, 140, and 150 may be separated from the substrate 100. Here, the semiconductor layers 130, 131, 140, and 150 may be separated from the substrate 100 by using a laser lift off (LLO) method.

Alternatively, the stacked semiconductor layers 130, 131, 140, and 150 may be separated from the substrate 100 by using a chemical lift off (CLO) method. In this case, by using a chemical solution, an external surface of the semiconductor layers 130, 131, 140, and 150 or an additional thin film layer formed on the external surface thereof may be typically etched to separate the semiconductor layers 130, 131, 140, and 150 from the substrate 100.

Figure 14:
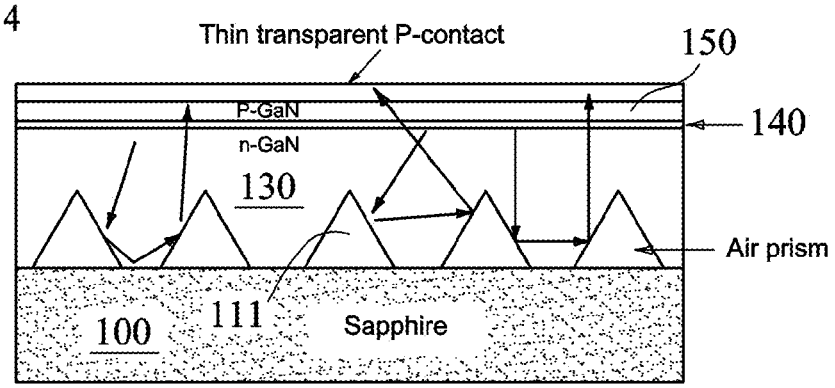
FIG. 14 is an outline view for describing a light extracting efficiency of the light emitting device in accordance with the embodiment of the present invention.
Figure 15:
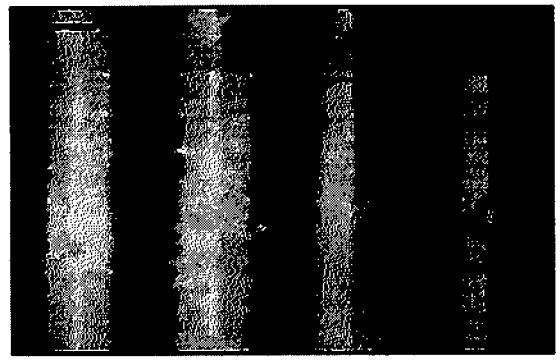
FIG. 15 is an optical photograph showing a surface of the light emitting device that is emitting a beam of light.

FIG. 14, which is a conceptual view for explaining a light extracting efficiency of the light emitting device in accordance with the embodiment of the present invention, shows how a beam of light generated from the active layer 140 is scattered by the air bars 111 to be transferred to an outside. FIG. 15 is an optical photograph showing a surface of the light emitting device that is emitting a beam of light scattered by the air bars 111 to be transferred to an outside.

As shown in FIGS. 14 and 15, beams of light generated from the active layer 140 may travel through the n-type layer 130 or the p-type layer 150 to be extracted to an outside. At this time, some of the beams of light traveling beyond an escape cone angle may be penetrated to the sapphire substrate 100 and kept in a space of the sapphire substrate 100 to disappeared, thereby deteriorating the light extracting efficiency.

To solve such a problem, the air bars 111 may be formed on the sapphire substrate 100 in the light emitting device in accordance with the present embodiment. Accordingly, most of the beams of light may be scattered or reflected by the air bars to be extracted to an upper and a lateral side of the device despite the large difference between refractive indexes of the semiconductor layers 130, 140, and 150 and the air. From the simulation result, it is seen that, if the inner inclined angle θ1 of the air bars 111 is in the range of 20° to 70°, it is possible to obtain the most outstanding light extracting efficiency, but, if the inner inclined angle θ1 thereof is beyond the range, the light extracting efficiency is lowered.

Figure 23:
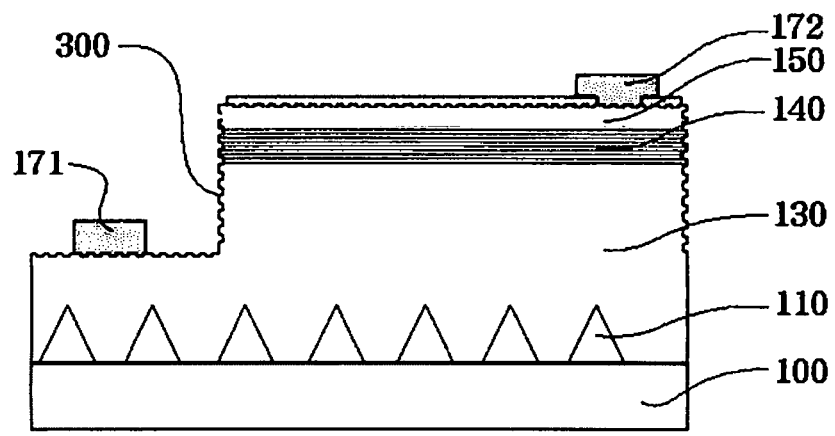
FIG. 23 is a sectional view showing how a scattering surface is formed on an external surface of a semiconductor layer in accordance with the embodiment of the present invention.

FIG. 23 is a sectional view showing how a scattering surface is further formed on an external surface of semiconductor layers in accordance with the embodiment of the present invention. An uneven scattering surface 300 may be randomly formed on a transmissive conductive layer or the external surface of the stacked semiconductor layers (outer surface of a layer located outside the n-type layer 130 or the p-type layer 150). Here, various shapes of prominences and depressions may be formed thereon. The uneven scattering surface 300 may be formed by applying roughness to the external surface of the semiconductor layers.

By using the scattering surface 300, the probability that the beams of light are scattered on the external surface may be increased to improve the external quantum efficiency. Alternatively, the scattering surface may be formed by applying the roughness to the external surface through the thin film growth using growth conditions such as pressure, temperature and the like in the nitride semiconductor growth.

Figure 24:
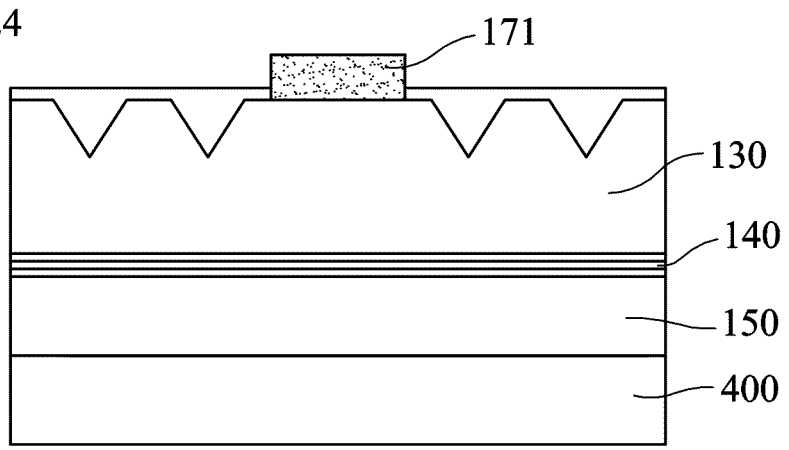
FIG. 24 is a sectional view showing an example that air bars are applied to a vertical light emitting device.

FIG. 24 is a sectional view showing a vertical light emitting device to which air bars are applied. When the air bars are applied to the vertical light emitting device, the semiconductor layers may be separated from the substrate 100 and brought into contacted with a metal layer 400. At this time, the air bars may be exposed in the upper surface of the semiconductor layers.

Figure 16:
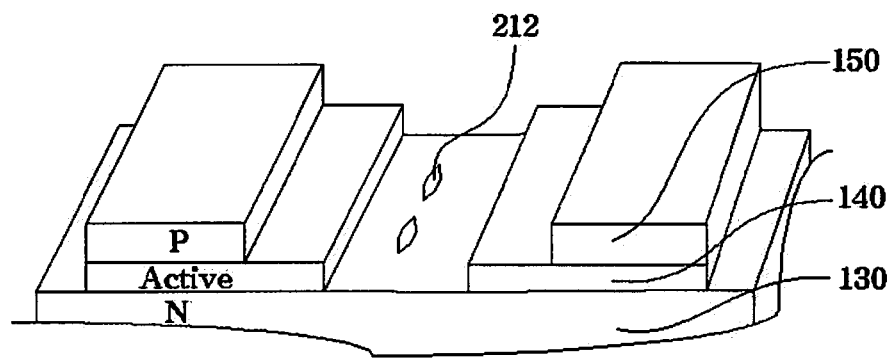
FIGS. 16 to 18 successively show how an etching guide pattern, an air-bar pattern, and an air-gap pattern are formed in accordance with the embodiment of the present invention.
Figure 17:
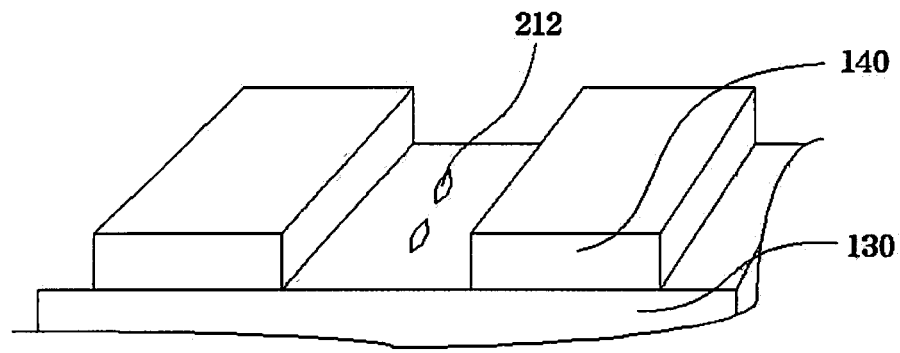
Figure 19:
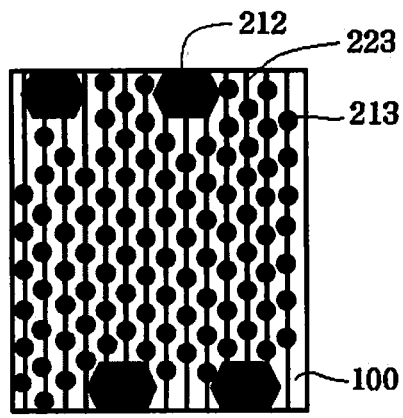
FIG. 19 is a plan sectional view showing a light emitting device having an etching guide pattern, an air-bar pattern, and an air-gap pattern in accordance with the embodiment of the present invention.

FIGS. 16 to 18 successively show how the etching guide pattern 212, the air-bar pattern 223, and the air-gap pattern 213 are formed in accordance with the embodiment of the present invention, and FIG. 19 is a plan sectional view showing the light emitting device having the etching guide pattern 212, the air-bar pattern 223, and the air-gap pattern 213 in accordance with the embodiment of the present invention.

Figure 20:
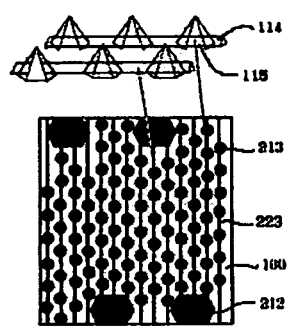
FIG. 20 three-dimensionally shows how air prisms and air bars are formed in accordance with the embodiment of the present invention.

FIG. 20 shows how the etching guide pattern 212 and the air-bar pattern 223 correspond to actually etched geometries.

Figure 21:
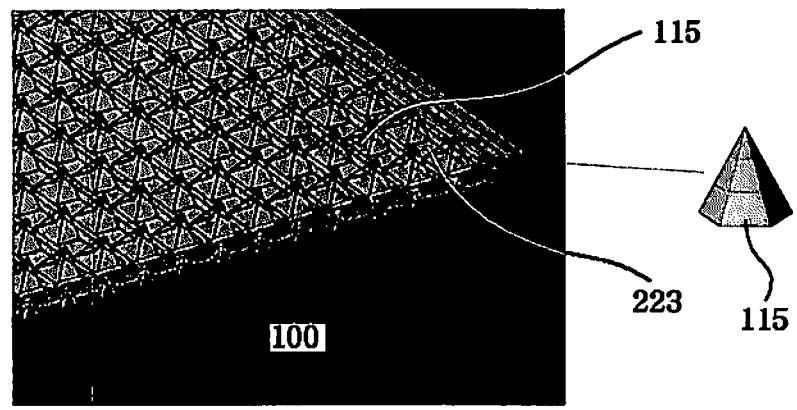
FIG. 21 shows how the air bars shown in FIG. 20 are successively formed.

FIG. 21 shows how the air prism 114 and the air gaps 115 shown in FIG. 20 are repeatedly formed.

As shown in FIGS. 16 through 18, after the p-type layer 150 is finally stacked in a successive order and the patterning process is carried out, the etching guide pattern 213 may be exposed. The wet-etching solution may be supplied along the air-bar pattern 223 connected to the etching guide pattern 212.

Moreover, by etching the patterns and, together or separately, carrying out anisotropic etching on the semiconductor layer 130, the prism shaped empty space of air bars 111 can be formed. Such processes can be repeatedly applied to the stacked semiconductor layer 131.

In the case of employing a $SiO_2$ film for the air-bar pattern 223 connected to the etching guide pattern 212, a buffered oxide etch (BOE) solution may be used to selectively etch the $SiO_2$ film. In contrast, a potassium hydroxide (KOH) solution may be efficiently used to permeate into and etch the semiconductor layers along the empty space where the patterns are etched. Accordingly, only one solution may be employed to form the air bars 111. Alternatively, after the etching guide pattern 212 is formed by using an etching solution, the semiconductor layers may be etched by using another etching solution.

As shown in FIG. 16, before the n-type electrode pad 171 (see in FIG. 1) is formed, the etching guide pattern 212 may be exposed.

As shown in FIGS. 19 to 21, in the light emitting device in accordance with the present embodiment, the etching guide pattern 212 and the air-bar pattern 223 may be connected to each other on the substrate 100. On the air-bar pattern 223, the air-gap pattern 213 may be provided where air gaps 115 are to be formed in a plural number.

At this time, the air-bar pattern 223 may be used to form the prism shaped air bars 111, i.e., the air prisms 114. The air-gap pattern 213 may be used to form variously shaped air gaps.

After the semiconductor layers 130, 131, 140, and 150 are formed to cover the air-bar pattern 223 capable of having various shapes, the air prisms 114 and the hexagonal-pyramid air gaps 115 may be formed through the wet etching following the shape of the pattern 213 where the air bars 111 is to be formed. The air bars may have various shapes depending on the patterns 213 and 223.

Accordingly, beams of light generated in the active layer to travel to the sapphire substrate 100 may be extracted to an upper side of the device by being scattered by the air prisms 114 and/or the air gaps 115. Therefore, in accordance with the present embodiment, the light extracting efficiency can be improved by using the air prisms 114 and/or the air gaps 115. As described above, the air gaps may have hexagonal pyramid shapes, and the air prisms 114 may have trigonal column shapes.

The sections of the air bars may be of a square, a triangle, or a hemisphere shape, but are not limited thereto. The air bars may have variously shaped sections.

Further, in the present embodiment, the air bars 111 and/or the air gaps 115 may be formed before the current diffusion layer 160 is formed. However, the present invention is not limited thereto. The air prisms 114 and/or the air gaps 115 may be formed after the current diffusion layer 160 is formed.

Meanwhile, as shown in FIG. 1, when the light emitting device is manufactured, an area of the etching guide pattern 212 may be equal to or greater than a preset size.

Figure 22:
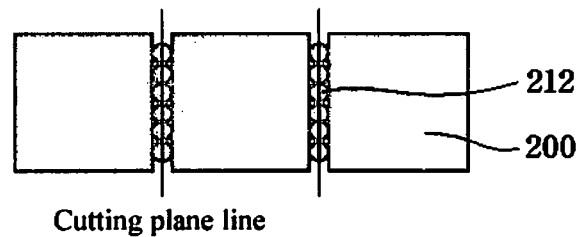
FIG. 22 is an example showing how a cutting plane line extends through etching guide patterns in a chip dicing.

FIG. 22 is an example showing how a cutting plane line extends through etching guide patterns during chip dicing. As shown in FIG. 22, when the holes of the etching guide pattern 212 are cut by using lasers during a dicing process of the processes in manufacturing the light emitting device, the chips 200 may be divided. Here, since a specific angle is applied to the cut holes, the light extraction may be induced from the holes.

As described above, the air bars of the present embodiment may be filled with a filling material, not a semiconductor layer (gallium nitride). A metal or a fluorescent material may be used as the filling material.

When the metal is used as the filling material, the air bars 111 may be filled by an electroplating method. When the fluorescent material is used as the filling material, the air bars 111 may be filled by using a spin coater and/or an ultrasonic wave. At this time, the sizes of the air bars 111 may be formed to be sufficiently larger than the particle size of the fluorescent material by allowing a gallium nitride layer to thickly grow (for example, thicknesses of the sapphire substrate and the gallium nitride layer are 400 μm and 10 μm, respectively).

As described above, as shown in FIG. 3, in the light emitting device, the arrangement of air bars in a first semiconductor layer may cross that of air bars in a second semiconductor layer.

Alternatively, the light emitting device may be formed in the structure having the air-bar pattern 223 only or the air-bar pattern 223 and the air-gap pattern 213 together without the etching guide pattern 212. Specifically, instead of forming the etching guide pattern 212, suppressing the growth of the semiconductor layers on the pattern 212 and using the wet etching, the air-bar pattern 223 (alternatively, the air-bar pattern 223 and the air-gap pattern 213) without the etching guide pattern may be formed and the semiconductor layers may be formed thereon. Thereafter, a dry-etching mask may be formed and the dry etching may be carried out by using dry-etching guide coupled plasma (ICP) equipment until the air-bar pattern 223 is exposed. If the air-bar pattern 223 is exposed, the air-bar pattern 223 is wet-etched.

Accordingly, in accordance with the present embodiment, a method of manufacturing a light emitting device may include: providing a substrate; forming a patterning thin-film layer on the substrate; forming an air-bar pattern on the patterning thin-film layer; forming a semiconductor layer(s) on the pattern; forming a mask layer on the semiconductor layer(s); patterning the mask layer to form a mask for dry-etching; wet-etching the air-bar pattern exposed by the dry-etching; and carrying out a wet-etching along a space where the air-bar pattern is wet-etched.

Moreover, in accordance with the present embodiment, a method of manufacturing a light emitting device may include: providing a substrate; forming a patterning thin-film layer on the substrate; forming an air-bar pattern on the patterning thin-film layer; forming a first semiconductor layer on the pattern; forming a mask layer on the first semiconductor layer to form a mask; patterning a mask for dry etching; allowing the air-bar pattern to be exposed by a dry-etching; forming a patterning thin-film layer on the first semiconductor layer; forming an air-bar pattern on the patterning thin-film layer; forming a second semiconductor layer on the pattern; forming a dry-etching mask on the second semiconductor layer and carrying out a dry-etching to expose the air-bar patterns of the first and the second semiconductor layer; carrying out a wet-etching along the air-bar patterns; and carrying a wet etching along a space where the air-bar patterns are wet-etched to form the space for a plurality of air bars. At this time, the mask layer can be designed such that positions of the air-bar patterns respectively exposed in the first and the second semiconductor layer are aligned each other. Alternatively, the method of manufacturing the light emitting device may further include: forming a dry-etching mask on the exposed second semiconductor layer after other semiconductor layers such as the active layer and the P-type layer or a thin-film layer such as the electrode layer are formed by a photolithography; carrying out a dry-etching to expose the air-bar patterns of the first and the second semiconductor layer; carrying out a wet-etching along the air-bar patterns; and carrying a wet etching along a space where the air-bar patterns are wet-etched to form the space for a plurality of air bars.

In accordance with the present embodiment, a method of manufacturing a light emitting device having two semiconductor layers with a plurality of air bars may also include: forming a patterning thin-film layer on a substrate or a thin-film layer; forming on the patterning thin-film layer an etching guide pattern and an air-bar pattern connected to the etching guide pattern; forming a first semiconductor layer on the patterns and exposing the etching guide pattern; forming a patterning thin-film on the first semiconductor layer; forming on the patterning thin-film layer an etching guide pattern and an air-bar pattern connected to the etching guide pattern; forming a second semiconductor layer on the pattern and exposing the etching guide layer of the second semiconductor layer while aligning the respective etching guide patterns of the first and the second semiconductor layer; wet-etching the exposed the etching guide patterns by using a wet-etching solution; and wet-etching the air-bar pattern connected to the etching guide pattern. In the method of manufacturing the light emitting device, after the forming of the semiconductor layer and the exposing of the etching guide patterns, a metal thin film(s) and another semiconductor layer(s) where no air-bar pattern is formed are stacked together or individually and a mask layer is provided to perform a photolithography, and then, when an upper layer of the formed semiconductor layer(s) where the air-bar pattern is formed is etched, a wet etching may be carried out.

In accordance with the present embodiment, a method of manufacturing a light emitting device including a plurality of semiconductor layers having an air-bar layer(s) with a plurality of air bars may also include processes of: forming a patterning thin-film layer on a substrate or a thin-film layer; forming on the patterning thin-film layer an etching guide pattern and an air-bar pattern connected to the etching guide pattern; forming a semiconductor layer(s) on the patterns and exposing the etching guide pattern; (A) forming a patterning thin-film layer on the semiconductor layer(s); (B) forming on the patterning thin-film layer an etching guide pattern and an air bar pattern connected to the etching guide pattern; (C) forming a semiconductor layer(s) on the patterns and exposing the etching guide pattern; (D) wet-etching the exposed etching guide layer by using a wet-etching solution; (E) wet-etching the air-gap pattern connected to the etching guide layer; and continuously repeating the processes (A) to (E). In the method of manufacturing the light emitting device, after the forming of the semiconductor layer and the exposing of the etching guide pattern, a metal thin film(s) and another semiconductor layer(s) where no air-bar pattern is formed are stacked together or individually and a mask layer is provided to perform a photolithography, and then, when an upper layer of the formed semiconductor layer(s) where the air-bar pattern is formed is etched, a wet etching can be carried out.

In addition, accordance with the present embodiment, a method of manufacturing a light emitting device including a plurality of semiconductor layers having an air-bar layer(s) with a plurality of air bars may include processes of: forming a patterning thin-film layer on a substrate or a thin-film layer; forming on the patterning thin-film layer an etching guide pattern and an air-bar pattern connected to the etching guide pattern; forming a semiconductor layer(s) on the patterns and exposing the etching guide pattern; (A) forming a patterning thin-film layer on the semiconductor layer(s); (B) forming on the patterning thin-film layer an etching guide pattern and an air bar pattern connected to the etching guide pattern; (C) forming an additional semiconductor layer(s) on the patterns and exposing the etching guide pattern; continuously repeating the processes (A) to (C) while aligning positions of the exposed etching guide patterns; continuously performing an etching along the etching guide patterns (the positions of the etching guide patterns being aligned to connect top to bottom) exposed on each uppermost layer of the semiconductor layers by using a wet-etching solution; and etching the air-bar patterns connected to the etching guide patterns on the layers. In the method of manufacturing the light emitting device, after the forming of the semiconductor layer and the exposing of the etching guide pattern, a metal thin film(s) and another semiconductor layer(s) where no air-bar pattern is formed are stacked together or individually and a mask layer is provided to perform a photolithography, and then, an upper portion of the formed semiconductor layer(s) where the air-bar pattern is formed is etched. Thereafter, a wet etching can be continuously carried out along the exposed etching pattern by using a wet-etching solution.

In accordance with the embodiment of the present invention, it is possible to a light emitting device and a method of manufacturing the same that can improve a light extracting efficiency by forming at least one air-bar layer where air bars having a specific shape(s) are formed on a region(s) where a semiconductor layer(s) is to be formed.

While the invention has been shown and described with respect to the embodiments, it will be understood by those skilled in the art that various changes and modification may be made without departing from the scope of the invention as defined in the following claims.

We claim:

1. A method of manufacturing a light emitting device including a plurality of semiconductor layers having an air-bar layer(s) with a plurality of air bars, the method comprising processes of:

forming a patterning thin-film layer on a substrate or a thin-film layer;

forming on the patterning thin-film layer an etching guide pattern and an air-bar pattern connected to the etching guide pattern;

forming a semiconductor layer(s) on the patterns and exposing the etching guide pattern;

(A) forming a patterning thin-film layer on the semiconductor layer(s);

(B) forming on the patterning thin-film layer an etching guide pattern and an air bar pattern connected to the etching guide pattern;

(C) forming an additional semiconductor layer(s) on the patterns and exposing the etching guide pattern;

continuously repeating the processes (A) to (C) while aligning positions of the exposed etching patterns;

continuously performing etching along the etching guide patterns, the positions of the etching guide patterns being aligned to connect top to bottom, exposed on each uppermost layer of the semiconductor layers by using a wet-etching solution; and etching the air-bar patterns connected to the etching guide patterns on the layers.

2. The method of claim 1, wherein, after the process of continuously repeating the processes (A) to (C) while aligning positions of the exposed etching patterns, a metal thin film(s) and another semiconductor layer(s) where no air-bar pattern is formed are stacked together or individually and a mask layer is provided to perform a photolithography, and then, when an upper layer of the semiconductor layer(s) where the air-bar pattern is formed is etched, a wet etching is carried out by using the wet-etching solution.

3. A method of manufacturing a light emitting device including a semiconductor layer(s) having an air-bar layer(s) with a plurality of air bars, the method comprising at least one process cycle, for forming the semiconductor layer(s), the process cycle comprising:

forming a patterning thin-film layer on a substrate or a thin-film layer;

forming on the patterning thin-film layer an etching guide pattern and an air-bar pattern connected to the etching guide pattern;

forming a semiconductor layer(s) on the patterns and exposing the etching guide pattern;

wet-etching the exposed etching guide pattern by using a wet-etching solution; and etching the air-bar pattern connected to the etching guide pattern.

4. The method of claim 3, wherein the process cycle further comprises at least one process cycle comprising:

forming a patterning thin-film layer on the semiconductor layer(s) for the air bars;

forming on the patterning thin-film layer an etching guide pattern and an air-bar pattern connected to the etching guide pattern;

forming an additional semiconductor layer(s) on the patterns and exposing the etching guide pattern;

wet-etching the exposed etching guide pattern by using a wet-etching solution; and etching the air-bar pattern connected to the etching guide pattern, thus resulting at least two semiconductor layers with an air bar layer, respectively, made of a plurality of air bars.

5. The method of claim 3, further comprising forming at least one additional semiconductor layer on the semiconductor layer(s), with the air bars, made by repeating the process cycle, the process cycle further comprising:

forming a patterning thin-film layer on the semiconductor layer(s) for the air bars;

forming on the patterning thin-film layer an etching guide pattern and an air-bar pattern connected to the etching guide pattern;

forming an additional semiconductor layer(s) on the patterns and exposing the etching guide pattern;

wet-etching the exposed etching guide pattern by using a wet-etching solution; and wet-etching the air-bar pattern connected to the etching guide pattern.

6. The method of claim 5, wherein the semiconductor layers includes an n-type layer, an active layer, and a p-type layer, and the semiconductor layers are formed by using a selective MOCVD method.

7. The method of claim 5, further comprising forming an uneven scattering surface on an external surface of an uppermost layer of the semiconductor layer(s).

8. The method of claim 5, further comprising forming a transmissive conductive film on an external surface of an uppermost layer of the semiconductor layer(s); and forming an uneven scattering surface on the transmissive conductive film.

9. The method of claim 5, further comprising separating the semiconductor layer(s) from the substrate.

10. The method of claim 9, wherein, in the separating of the semiconductor layer(s) from the substrate, an LLO method is used.

11. The method of claim 9, wherein, in the separating of the semiconductor layer(s) from the substrate, a CLO method is used.

12. The method of claim 3, further comprising forming an air-gap pattern in the forming of the etching guide layer and the air-bar pattern connected thereto.

13. The method of claim 3, wherein the air-bar layers are arranged crossing each other.

14. The method of claim 3, wherein the air-bar layers are arranged crossing each other at a crossing angle(s).

15. The method of claim 3, wherein the patterning thin-film layer is made of one of oxide, nitride, tungsten, and platinum.

16. The method of claim 3, wherein the wet-etching solution includes at least one of sodium hydroxide, potassium hydroxide, sulfuric acid, phosphoric acid, aluetch, and hydrofluoric acid.

17. The method of claim 3, wherein a wet-etching is induced by forming an electrode on a surface of the semiconductor layer(s) and supplying a current or a beam of light thereto.

18. The method of claim 3, wherein the etching guide pattern and the air-bar pattern, respectively or together, are periodically arranged.

19. The method of claim 3, further comprising filling a fluorescent material in the air bars by using a spin coater.

20. The method of claim 3, further comprising filling a fluorescent material in the air bars by using an ultrasonic wave.

21. The method of claim 3, further comprising filling a metal in the air bars by using an electroplating method.

* * * * *